United States Patent
Rashev et al.

(10) Patent No.: US 7,251,290 B2
(45) Date of Patent: Jul. 31, 2007

(54) ADAPTIVE CONTROLLER FOR LINEARIZATION OF TRANSMITTER

(75) Inventors: Peter Zahariev Rashev, Calgary (CA); David M. Tholl, Calgary (CA); Christopher John Leskiw, Calgary (CA)

(73) Assignee: Nortel Networks Limited, St. Laurent (CA)

( * ) Notice: Subject to any disclaimer, the term of this patent is extended or adjusted under 35 U.S.C. 154(b) by 689 days.

(21) Appl. No.: 10/321,011

(22) Filed: Dec. 16, 2002

(65) Prior Publication Data

US 2004/0198268 A1 Oct. 7, 2004

(51) Int. Cl.
*H04K 1/02* (2006.01)

(52) U.S. Cl. ............ 375/296; 327/133; 327/140; 332/160; 375/297; 398/159; 398/193; 455/69; 455/114.3; 455/126

(58) Field of Classification Search ............ 330/149; 375/296; 455/69, 114, 115, 126
See application file for complete search history.

(56) References Cited

U.S. PATENT DOCUMENTS

| | | | | |
|---|---|---|---|---|
| 4,577,334 A | * | 3/1986 | Boer et al. ............ | 375/344 |
| 4,717,894 A | | 1/1988 | Edwards et al. ............ | 332/20 |
| 5,113,414 A | * | 5/1992 | Karam et al. ............ | 375/296 |
| 5,119,399 A | | 6/1992 | Santos et al. ............ | 375/10 |
| 5,371,481 A | | 12/1994 | Tiittanen et al. ............ | 332/103 |
| 6,133,789 A | * | 10/2000 | Braithwaite ............ | 330/149 |
| 6,147,553 A | | 11/2000 | Kolanek ............ | 330/10 |
| 6,169,463 B1 | | 1/2001 | Mohindra et al. ............ | 332/104 |
| 6,208,698 B1 | | 3/2001 | Marchesani et al. ............ | 375/298 |
| 6,298,096 B1 | | 10/2001 | Burgin ............ | 375/296 |

OTHER PUBLICATIONS

Anit Lohita, Paul Goud, Colin Englefield; Power Amplifier Linearization using Cubic Spline Interpolation; May 18-20, 1993; IEEE Vehicular Technology Conference; pp. 676-679 □□.*
Jones, A.E., Gardiner, J. G.; Phase error correcting vector modulator for personal communications network (PCN) transceivers; Jul. 4, 1991; Elecrtronics Letters, vol. 27, issue 14; pp. 1230-1231 □□□□.*
Sano et al; Identification of Hammerstein-Wiener system with application to compensation for nonlinear distortion; SICE 2002. Proceedings of the 41st SICE Annual Conference; vol. 3, Aug. 5-7, 2002; pp. 1521-1526.*

* cited by examiner

*Primary Examiner*—David C. Payne
*Assistant Examiner*—Adolf DSouza
(74) *Attorney, Agent, or Firm*—Schwegman, Lundberg, Woessner, & Kluth, P.A.

(57) ABSTRACT

A bank of complex gain elements is used to provide a step-wise approximation of an arbitrary complex-gain predistortion function for a nonlinear transmitter. The bank of gain elements is in an adaptive loop realizing adaptive control. The adaptive loop is closed between an Input of the gain bank and an output of the transmitter through a linear receiver at an adaptive controller composed of a bank of proportional-integral (PI) controllers. The real and imaginary parts of each predistortion gain element are controlled by a corresponding adaptive PI controller. The signals processed by the adaptive controller are represented in orthogonal coordinates in terms of real and imaginary number pairs of complex numbers. The adaptive controller achieves unconditionally stable operation independently from the arbitrary phase rotation in the input signal or the adaptive loop.

13 Claims, 4 Drawing Sheets

ADAPTIVE CONTROLLER FOR LINEARIZATION OF TRANSMITTER

Incorporation by Reference

Co-pending commonly assigned U.S. patent application Ser. No. 10/321,045 filed on the same date herewith and titled "Adaptive Controller for Linearization of Transmitter with Impairments" is hereby incorporated by reference.

FIELD OF THE INVENTION

The present invention relates to transmitters, and in particular to an adaptive linearization controller for a transmitter.

BACKGROUND OF THE INVENTION

Some signal transmitters for cellular communications utilize QAM (quadrature amplitude modulation) to increase the number of signals that can be transmitted on a given channel. QAM is a method of combining two amplitude-modulated (AM) signals into a single channel to effectively double the effective bandwidth. QAM is used with pulse amplitude modulation (PAM) in digital systems, especially in wireless applications.

In a QAM (quadrature amplitude modulation) signal, there are two carriers, each having the same frequency but differing in phase by 90 degrees (one quarter of a cycle, from which the term quadrature arises). The two modulated carriers are combined at the source for transmission. At the destination, the carriers are separated, the data is extracted from each, and then the data is combined into the original modulating information.

Radio transmitters amplify input signals. It is desired that the gain of such transmitters be linear for the entire range of input signals. Memoryless linearization of signal transmitters and, in particular, of radio transmitters is closely related to the problem of power amplifier linearization using baseband techniques, which is considered to be of the greatest significance for achieving effective and economical minimization of transmission-related signal distortions in digital communication systems. Despite a big diversity of existing approaches aimed at improving the quality of RF power amplification, many of the older solutions are constrained to usage with specific discrete-level signaling formats, and, thus have a limited relevance to contemporary wideband communication standards. Development of general solutions of a particular practical value that are invariant with respect to the transmitted signal has been simulated in the past decade, pointing out the usefulness of a single-argument complex gain function of the input power for the modeling of memoryless distortions in baseband power amplifier linearizers. Compared to the previously demonstrated general approach using two-dimensional mapping of the amplifier output against the phase and magnitude signal values at its input, the gain-based nonlinear model has a substantially lower computational complexity for the same performance that is instrumental in the design of hardware-efficient digital linearization systems.

A common architecture of recently proposed baseband power amplifier linearizers includes a digital nonlinear gain block, usually called a predistortion block, inserted in the transmitter chain prior to upconversion stages. It is continuously adapted to approximate as closely as possible the inverse nonlinear complex gain of the following transmitter stages up to the power amplifier. Depending on the coordinate system in which the transmitter gain estimation is conducted two main types of baseband linearization approaches can be distinguished: (1) orthogonal-coordinate, where the complex gain function is defined by a pair of real and imaginary functions, and (2) polar-coordinate, where the complex gain function is defined by a magnitude and a phase function. Since in QAM schemes the signals are typically represented by in-phase and quadrature-phase components, i.e. in orthogonal coordinates, the realization of the second approach involves additional complexity to provide for coordinate system transformation of the estimation data. On the other hand, more sophisticated adaptation algorithms are required for the implementation of unconditionally convergent and robust baseband linearization in orthogonal coordinates.

For QAM signaling schemes, such as CDMA and UMTS, the realization of the first approach would be naturally simpler since signal format conversions could be avoided. On the other hand, from the perspective of real-time adaptation of the predistorter gain more complexity should be added to the respective algorithms because of the nonlinear behavior of the predistortion gain gradient as a function of the average phase of the linearized transmitter gain.

The realization of the second linearization approach requires additional means for coordinate system transformation of the estimation data and the predistorted signal such as orthogonal-to-polar and polar-to-orthogonal conversion blocks (note that this is true if the signal is represented by its in-phase/quadrature-phase components in the transmitter). The major advantage of using polar-coordinate representation of the linearized transmitter gain is that the iterative derivation of the predistortion gain is invariant with respect to the average gain phase in this coordinate system. On the other hand, the biggest disadvantages are the large amount of hardware resources needed for the implementation of precision trigonometric/inverse-trigonometric functions performing the coordinate transformations and, most importantly, the noise-biasing effects associated with processing the modulus of noisy complex data.

Although offering a basis for potentially more efficient implementation of predistorter adaptation algorithms, the orthogonal coordinate approach has been a subject of analyses and evolution in only few theoretical and experimental studies. The two existing forms of orthogonal adaptation can be viewed as first and second order approximations of Newton's method for numerical minimization of functions with complex variable using consecutive iterations proportional to the function first derivative. The first and less accurate approximation uses a single constant to represent the average absolute value of the first derivative (a linear iteration method); while the second and more accurate one uses the ratio of finite function and argument differences for continuous first derivative estimation (a secant iteration method). The first adaptation approach totally ignores the phase of the function argument and by this introduces ambiguity with respect to it, which practically makes the algorithm convergence dependent on the signal phase rotation taking place in the transmitter. This limitation can be overcome by an additional signal phase rotation in the algorithm to equalize for it. The second adaptation approach does not have this disadvantage and provides faster convergence towards the function minimum but involves a division operation that increases its susceptibility to noise.

In one attempt to provide a linearized system, a rectangular representation of the data is used in error processing circuits along with a proportional-integral adaptation algorithm. However, the error formation circuits involve a highly inefficient complex division operation. Moreover, an additional rotation of the phase of the feedback signal derived from the transmitter output is required for stable algorithm operation.

Same data representation has been recently adopted in a method of linearizing a power amplifier in a mobile communication system, where the division operation is avoided while using simple integration of the scaled error signal under the assumption that the average phase difference between the input signal to the transmitter and the feedback signal is small. Nevertheless, the overall system complexity remains high since correction of the transmitted signal phase is performed using a delay line prior to power amplification. In addition, the fixed amount of phase correction typically provided by the delay line should match the average phase rotation caused by the analog system components and, thus, may not always be convenient in practical cases.

In yet another approach, amplifier linearization by adaptive predistortion is attempted. The linearization algorithm is stable with respect to the phase of the feedback signal since it uses a secant iteration method involving the phase of the error as a separate term to perform faster adaptation of the predistortion gain. Nevertheless, this algorithm still requires a complex division by the error signal, which is not only inefficient but also increases the system susceptibility to noise.

An unconditionally stable baseband linearization method performs adaptation in polar coordinates, while representing the predistortion gain by its magnitude and phase components. Although realized by a fairly simple and robust adaptive algorithm, such methods have substantial implementation complexity because of the use of orthogonal-to-polar-to-orthogonal coordinate conversion of the input signal as well as orthogonal-to-polar transformation of the feedback signal. Moreover, the estimation of the predistortion gain magnitude is biased proportionally to the noise power in the feedback channel.

A linearization system utilizes polar-coordinate signal representation of data in the adaptive predistortion algorithm, which is invariant with respect to the average phase of the transmitter gain. First, the transmitter gain is estimated by applying forward system modeling, and, afterwards it is inverted into predistortion magnitude and phase. The inversion is implemented using polar-coordinate representation and avoids complex division operations required in the orthogonal-coordinate number format. The method involves inefficient coordinate system transformations of the input and feedback signals as well as extra means to implement (real-time) inversion of an arbitrary real-valued function. In addition, the predistortion gain is realized in two steps using a scaling operation and a multiplication by complex exponent function operation.

SUMMARY OF THE INVENTION

A bank of complex gain elements is used to provide a step-wise approximation of an arbitrary complex-gain predistortion function for a non-linear transmitter. The bank of gain elements is in an adaptive loop realizing adaptive memoryless control in one embodiment. The adaptive loop is closed between an input of the gain bank and an output of the transmitter through a linear receiver at the bank of adaptive controllers. The real and imaginary parts of each predistortion gain element are controlled by a corresponding adaptive controller from the controller bank and are optimized to cancel the time-domain difference between the input signal and the received (e.g. down-converted to baseband and sampled) signal.

In one embodiment, the error difference cancellation is accomplished by a bank of linear adaptive controllers through three stages of processing including (1) error phase normalization, (2) error magnitude normalization, and (3) error scaling and integration, which provide respectively unconditional stability (stage 1), lowered susceptibility to signal changes (stage 2) and low-pass noise filtering of the adaptation process (stage 3).

In a further embodiment, the input and received signals are processed by a bank of nonlinear adaptive controllers and cancellation of the error difference between them is accomplished through two stages of processing: (1) error magnitude normalization and (2) multiplicative error integration, which provide respectively lowered susceptibility to signal changes (stage 1) and unconditional stability and low-pass noise filtering of the adaptation process (stage 2).

DETAILED DESCRIPTION OF THE INVENTION

Figure 1:
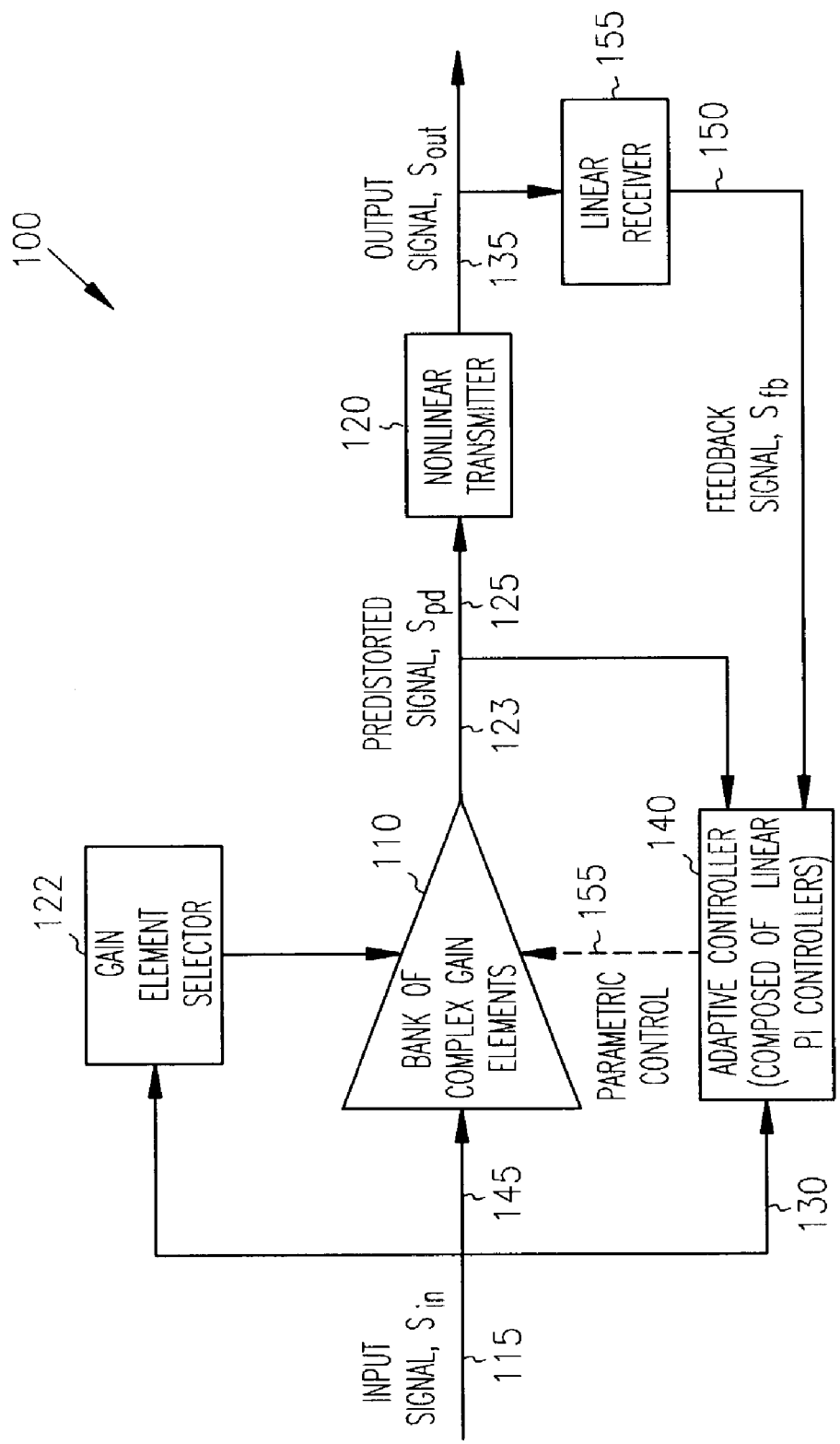
FIG. 1 is a block diagram of a transmitter linearization loop realizing memoryless control.

In the following description, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

References to signals and lines carrying such signals are made with the same reference number. While the invention is described with respect to circuitry, and blocks representing such circuitry, it is recognized that various combinations of software, hardware and firmware may be used provided adequate processing speed is obtained by such combinations.

Effective minimization of transmitted nonlinear distortions of baseband power amplifiers is achieved by predistorting the transmitted signal prior to upconversion. The predistortion process can be represented as passing the baseband transmitted signal through an amplifier with nonlinear complex gain. The nonlinear complex gain, also called predistortion gain is adjusted to minimize baseband time-domain differences between the transmitted signal prior to upconversion and the RF transmitted signal, which eventually forces the baseband spectra of these two signals to match closely. In one embodiment of the invention, continuous adaptation of the predistortion gain provides for minimal baseband signal distortion as time passes and operating conditions change.

Input and output signals of a digital predistortion block as well as a feedback signal representing the received (e.g. down-converted to baseband and sampled) output signal of a nonlinear transmitter cascaded with it are processed by an adaptive controller. The controller outputs are connected to the predistortion block to define the predistortion gain values. The latter are optimized to cancel the time-domain difference between the input and the feedback signals.

The proposed invention solves the problem of memory-less linearization of signal transmitters using an adaptive control system operating in hardware-efficient orthogonal-coordinate complex number format (i.e. utilizing pairs of real numbers interpreted as the real and imaginary parts of a complex number which modulus and argument are equal to the signal magnitude and phase respectively). The architecture and principle of operation (i.e. the control algorithm) of two controllers managing this system is described. Both controllers process data in orthogonal coordinates. The first one performs the adaptive update of the predistortion gain in orthogonal coordinate sense by updating independently its real and imaginary parts. The second one does it in polar-coordinate sense by performing correlated update of the real and imaginary parts in terms of magnitude and phase. A resolution of a secondary problem of algorithm stabilization, when the adaptation is performed in orthogonal coordinates, is also provided for arbitrary average phase rotation occurring in the transmitter. In addition, means are offered to increase the algorithm robustness with respect to signals with non-stationary probability distributions.

Orthogonal-Coordinate Based Adaptation of the Predistortion Gain

A high-level block diagram of an adaptive control system for transmitter linearization is shown at 100 in FIG. 1. In the case of RF transmitter linearization, a bank of complex gain elements 110, which realizes a step-wise approximation of an arbitrary complex gain function, is inserted before a baseband input 125 of a nonlinear transmitter 120. For each sample of the input signal $S_{in}$ 115, a corresponding gain element from the bank of gain elements 110 is selected by use of a selection law implemented at a gain element selector 122 to form a predistorted signal $S_{pd}$ 123 that is then fed to the transmitter input 125. The selection law may not be unique with respect to the gain bank, meaning that the same gain element can be predistorting input signal samples of different value.

An adaptive loop is closed between the input of the gain bank 145 and the output of the transmitter 135 at an adaptive controller 140. A forward branch of the loop 130 is connected directly to the system input and accepts the input signal to the transmitter $s_{in}$. A feedback branch 150 of the loop is connected to the transmitter output through a linear receiver 155 so that a baseband version, $S_{fb}$, of the output RF transmitted signal $s_{out}$ can be provided to the adaptive controller 140. The latter is composed of a bank of linear adaptive controllers, which perform continuous adjustment of the parameters 155, real and imaginary part, of their corresponding gain elements from the predistortion gain bank. An additional information input delivering the predistorted signal $s_{pd}$ 123 is utilized by the adaptation algorithm to ensure stable controller operation.

Figure 2:
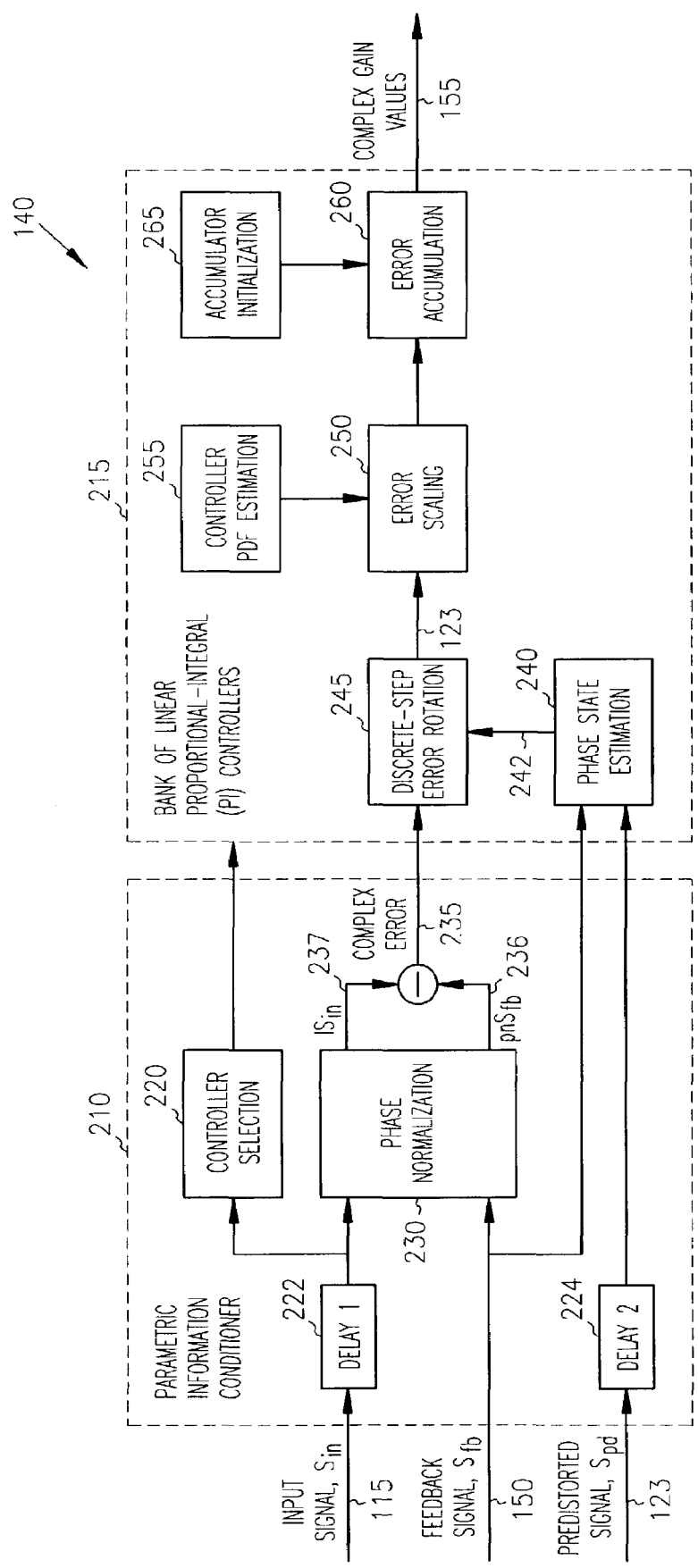
FIG. 2 is a block diagram of a bank of linear adaptive controllers using optimization in rectangular coordinates to implement memoryless linearization of a transmitter.

FIG. 2 shows a functional diagram of the adaptive controller 140, which employs three inputs and as many outputs as the number of complex gain elements in the predistortion gain bank. Structurally, it is divided in two sections: parametric information conditioner 210 and a bank of linear proportional-integral (PI) controllers 215. Functional blocks (FBs) from the first section operate over the full dynamic range of the input signal. The second section can be viewed as a waffle structure with each layer containing an identical set of functional elements (FEs) necessary to compose a single PI controller from the bank. Identical FEs from different layers, i.e. belonging to different PI controllers form a bank-FB. The layer that processes a particular combination of input samples is chosen by the controller selection FB 220 in the conditioner section 210. Further, in this disclosure, the bank of PI controllers 215 is described by the structure and relationships among the FEs of a single layer.

Prior to processing the input $s_{in}$ 115 and the predistorted $S_{pd}$ 123 signals are synchronized with the feedback signal $s_{fb}$ 150 in two delay blocks, delay 1 222 and delay 2 224 FBs respectively. The delay 1 FB 222 accounts for the finite propagation speed of the input signal through the bank of complex gain elements 110, the nonlinear transmitter 120 and the linear receiver 155 until it reaches the adaptive controller 140 (see FIG. 1). The delay 2 FB 224 accounts for the latency of the nonlinear transmitter 120 and the linear receiver 155. Following synchronization, both the input and the feedback signals are rotated by the negated phase angle of the input signal in the phase normalization FB at 230. At the outputs of this block a complex error signal 235 is created by subtracting a phase-normalized feedback signal $pns_{fb}$ 236 from a real signal $|s_{in}|$ 237 representing the magnitude of the input signal.

Once a particular PI controller is selected by the controller selection FB 220 the following three signals are accepted by its FEs: the complex error 235, the feedback signal 150 and the delayed predistorted signal 123. The last two are used by a phase state estimation FE 240, which outputs a 4-state control signal 242 to a discrete-step error rotation FE 245. The four control states correspond to four unit circle sectors where the phase difference between the feedback and pre-distorted signals can fall in. The sectors' boundaries are the angle bisectors of the four unit circle quadrants. Depending on the value of the control signal the complex error is rotated by 0, 90, 180 or 270 degrees in the discrete-step error rotation FE 245 whose function is described in further detail below. The rotated complex error is then scaled down in an error scaling FE 250, which realizes also the proportional part of the PI controller in addition to the magnitude normalization of the complex error. The scaling size is inversely proportional (1) to the average magnitude of the input signal samples forming the complex error for this PI controller, which is usually a constant known in advance; and (2) to the probability of selecting this PI controller, which depends on the controller selection law as well as on the probability density function (pdf) of the input signal. Since the latter is typically non-stationary, an ensemble pdf representing the statistical probability of selecting the PI controller is continuously estimated in a controller pdf estimation FE 255 and provided to the error scaling FE 250. An error accumulation FE 260 is the last processing stage of this section, which realizes the integral part of the PI controller by accumulating over time the rotated and scaled complex error samples. The initial state of this FE is specified in an accumulator initialization FE 265. Its real and imaginary outputs 155 define a complex value to specify the gain of a corresponding element from the gain bank from FIG. 1.

Minimization of the nonlinear distortions inflicted in a signal during RF transmission can be achieved if a feedback signal, that is a downconverted and sampled version of the signal at the transmitter output, is closely matched with the input (baseband) signal to this transmitter (see FIG. 1). In this case the narrowband spectrum of the RF transmitted signal is similar to the double-sided baseband spectrum of the input signal provided that the receiver in the feedback branch of the adaptive loop is distortionless. Therefore, the criterion of the optimization process carried by the adaptive controller can be defined as:

$$S_{in} \approx S_{fb} \Leftrightarrow S_{in} - S_{fb} \to 0$$

This criterion is met if the overall gain of the cascaded bank of complex gain elements, nonlinear transmitter and linear receiver is unity. If the receiver gain is chosen to be 1 for simplicity of explanation, then, the values of the gain bank approximate the inverse transmitter gain:

$$G_{pd} \approx \frac{1}{G_{tx}} \qquad 2$$

where $G_{pd}$ is a continuous function interpolation of the complex values stored in the bank of complex gain elements and $G_{tx}$ is the nonlinear transmitter gain.

It has been shown that memoryless transmitter nonlinearity is modeled with sufficient accuracy using complex functions of the input signal amplitude, i.e. $G_{tx}=G_{tx}(|S_{pd}|)$. Hence, the gain bank is chosen to approximate a nonlinear function of the input signal magnitude: $G_{pd}=Gpd(|S_{in}|)$. Since the implementation of accurate continuous approximation of arbitrary functions in digital hardware is resource consuming, it is convenient that the complex predistortion function $G_{pd}( )$ is represented by a staircase function. The values of the two functions are guaranteed to be the same only for a finite number of discrete values of the argument, which form a 1-dimensional grid. A value of the staircase function for an argument that is off the grid is equal to the function value corresponding to the closest grid mark.

In the currently discussed linearization system the grid information is contained in the gain selector 122 from FIG. 1 as well as in the controller selection FB 220 from FIG. 2. Both blocks have the same functionality, which can be summarized as discrimination of the full dynamic range of the input signal in a finite number of magnitude bands. The number of magnitude bands is equal to the number of elements in the gain bank 110 from FIG. 1 and the controller bank 215 from FIG. 2. If for a given dynamic range the number of bands is sufficiently big, i.e. the step of the grid is sufficiently small, the transmitter behavior can be approximated as linear for the signal samples belonging to one magnitude band. Thus, the necessary condition from Eq. 2 can be approximated by:

$$G_{(k)pd} \approx \frac{1}{G_{(k)tx}} \Leftrightarrow G_{(k)pd} \cdot G_{(k)tx} \approx 1 \qquad 3$$

where $G_{(k)pd}$ is the complex gain value stored in the k-th element from the gain bank 110 and $G_{(k)tx}$ is the average transmitter gain affecting the samples from the k-th magnitude band.

The task of the adaptive controller 140 from FIG. 1 is to iteratively find such values of the gain bank 110 $G_{(k)pd}$ so that Eq. 3 becomes as close as possible to an equality for any k. As long as the transmitter behavior is quasi-linear for each magnitude band, a bank of linear adaptive controllers 215 (see FIG. 2) can perform a real-time optimization of the above equation.

Quantitative information about the divergence of the overall transmitter gain from the desired unity value (see Eq. 3) is contained in the complex error 235 derived as a difference between the phase normalized input 237 and feedback 236 signals (see FIG. 2):

$$|S_{(k)in}| - pnS_{(k)fb} = |S_{(k)in}|(1 - G_{(k)pd} \cdot G_{(k)tx}) \approx mean|S_{(k)in}| \cdot (1 - G_{(k)pd} \cdot G_{(k)tx}) \qquad 4$$

where $s_{(k)in}$ represents the input signal samples from the magnitude band k and $pns_{(k)fb}$–their phase normalized counterparts from the feedback branch; $mean|S_{(k)in}|$ is the average magnitude of the input signal in this magnitude band; and $1-G_{(k)pd} \cdot G_{(k)tx}$ is the optimization gain error for this magnitude band.

The gain error from Eq. 4 is extracted after phase and magnitude normalization in the discrete-step error rotation 245 and error scaling 250 FEs respectively.

The error phase normalization provides appropriate signs for the real and imaginary parts of the error so that a negative adaptive feedback is maintained independently from the average phase rotation of the feedback signal. The rotation angles are given in the following table:

| Interval of average phase rotation in magnitude band k, deg | Discrete Error Rotation Angle, deg |
|---|---|
| 0:45 | 0 |
| 45:135 | 270 |
| 135:235 | 180 |
| 235:315 | 90 |
| 315:360 | 0 |

To avoid oscillations at the boundary values the phase state estimation FE 240 should be implemented with hysteresis. Adding hysteresis helps to lower the precision requirement for this FE. A hysteresis window of up to 10 deg is usually sufficient in practical cases.

The error magnitude normalization provides independence from the parameters of the input signal in a sense that all PI controllers have operating bandwidths that are not a function of the magnitude band number k. In fact, they become proportional to the average transmitter gain in the magnitude band. In most practical cases the variation of the transmitter gain magnitude over dynamic range, i.e. its nonlinearity, is less than 20%, which allows the PI controllers to have similar bandwidths. Big differences between those bandwidths correspond to largely different adaptation time-constants that may result in 'twisting' of the predistortion values of the gain bank over dynamic range and only partial transmitter linearization, especially when the transmitter nonlinearity changes fast with respect to the slow-adapting PI controllers. This type of normalization is realized in the error scaling FE 250, where the rotated complex error is divided by the average magnitude of the input signal for the particular magnitude band, that is a constant depending on the supported dynamic range and grid, as well as by the probability of selection of this band, that is a continuously estimated parameter. Depending on the tolerable size of the difference among the bandwidths of the PI controllers (e.g. up to 2 times) the division operation can be implemented with lower precision as a scaling operation using a finite set (e.g. a set of 256 to 1024 values) of constants to approximate the full range of reciprocal probability values. Saturation of the error magnitude normalization may be considered for very small denominator values because of noise enhancement effects.

After normalization the complex error is subjected to further scaling in the error scaling FE 250 and then integration in the accumulation FE 260:

$$Y_{(k)}{}^n = Y_{(k)}{}^{n-1} + \mu \cdot err_{(k)} \qquad 5$$

where the real parameter $\mu$ is the "adaptation step" which is the same for all PI controllers; $Y''_{(k)}$ is the output of the k-th controller at the discrete time instant n; and $err_{(k)}$ is the phase- and magnitude-normalized complex error. In the perspective of the adaptive loop including the PI controller bank 265 and the nonlinear transmitter 120 (see FIG. 1), the effect of the accumulation is modified to the equivalent of a low-pass filtering operation described by the state-space equation:

$$Y_{(k)}(s) = \frac{\frac{1}{G_{(k)tx}}}{1 + \frac{s}{\mu G_{(k)tx}}} G_{(k)pd} = Y_{(k)}(s) \qquad 6$$

where $Y_{(k)}(s)$ is the state-space output 155 of the k-th controller. Conclusively, within the operating bandwidth of a particular PI controller, that is proportional to $\mu|G_{(k)tx}|$, the predistortion gain exercised by the attached to it complex gain element is approximately equal to the average inverse transmitter gain within the corresponding magnitude band as required in Eq. 3.

Polar-Coordinate Based Adaptation of the Predistortion Gain

In a further embodiment, memoryless linearization of signal transmitters is performed using an alternative adaptive control system. The control algorithm of the controller managing this system employs a hardware-efficient orthogonal-coordinate representation of the complex number data and avoids coordinate system transformations. Inherent stability issues associated with this complex number format are avoided by introducing polar-coordinate interpretation of the orthogonal-coordinate error signal between the input signal to the transmitter and feedback signal and by performing respective scale and rotate adjustments of the predistortion gain by the means of multiplicative accumulation. In addition, the phase normalization of the input signal that is a required step in the preprocessing of the parametric data is substantially simplified when realized as 45-deg step-wise rotation of the error signal.

Figure 3:
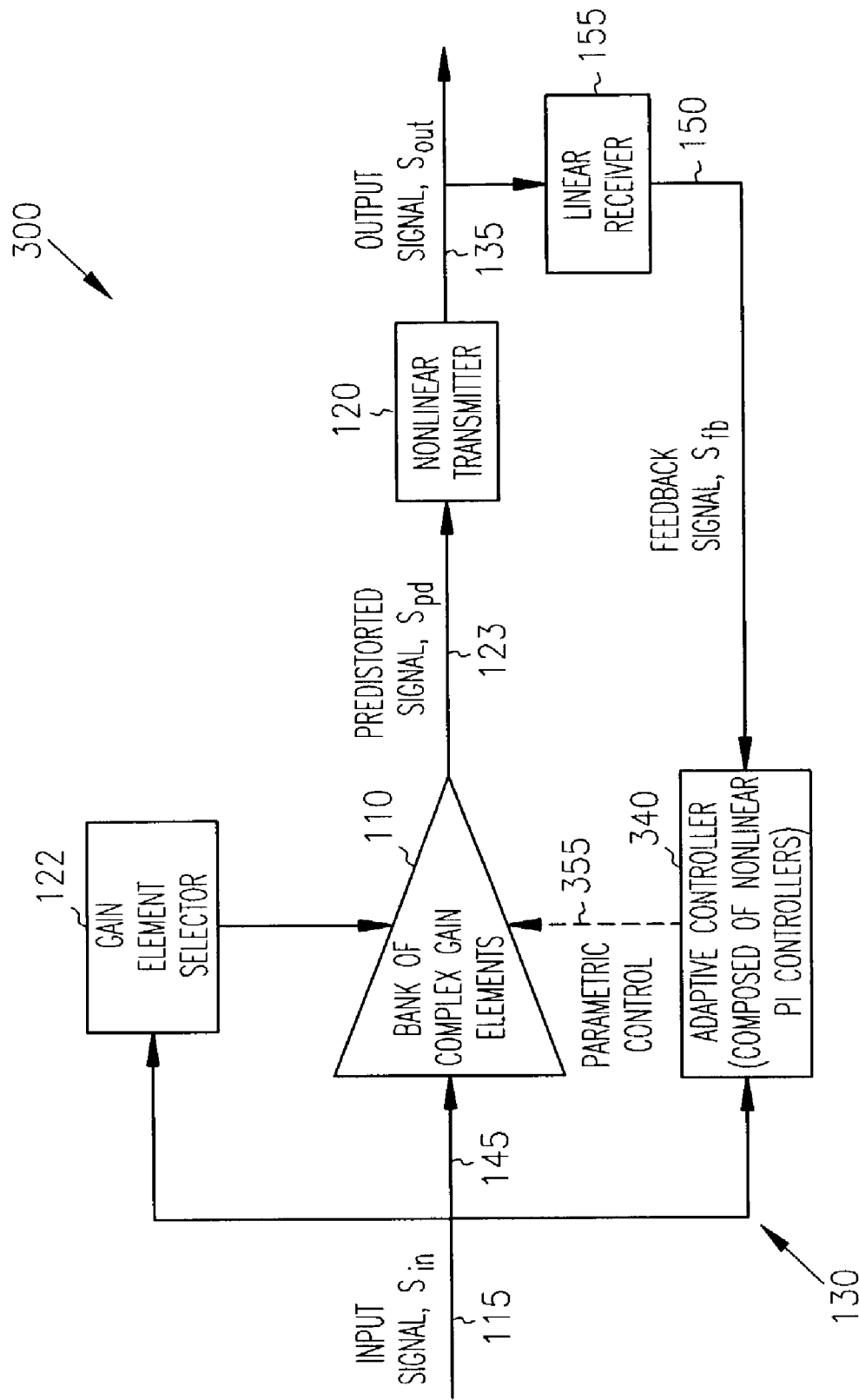
FIG. 3 is a block diagram of an alternative transmitter linearization loop realizing memoryless control.

A high-level block diagram of a baseband adaptive control system for transmitter linearization using the suggested controller architecture is presented at 300 in FIG. 3. In the case of RF transmitter linearization, a bank of complex gain elements 110, which realizes a step-wise approximation of an arbitrary complex gain function, is inserted before the baseband input of a nonlinear transmitter 123. For each sample of the input signal $s_{in}$ 115, a corresponding gain element is selected by use of a selection law implemented at a gain element selector 122 to form a predistorted signal $S_{pd}$ 123 that is then fed to the transmitter input. The selection law may not be unique with respect to the gain bank, meaning that the same gain element can be predistorting input signal samples of different value.

The adaptive loop is closed between the input of the gain bank 145 and the output of the transmitter 135 at an adaptive controller 340 that is the subject of this disclosure The forward branch of the loop 130 is connected directly to the system input and accepts the input signal to the transmitter $S_{in}$ 115. The feedback branch 150 of the loop is connected to the transmitter output through a linear receiver 155 so that a baseband version, $s_{fb}$ 150, of the output RF transmitted signal $s_{out}$ 135 can be provided to the adaptive controller 340. The latter is composed of a bank of nonlinear adaptive controllers, which perform continuous adjustment of the parameters 355, real and imaginary part, of their corresponding gain elements from the predistortion gain bank 110.

Figure 4:
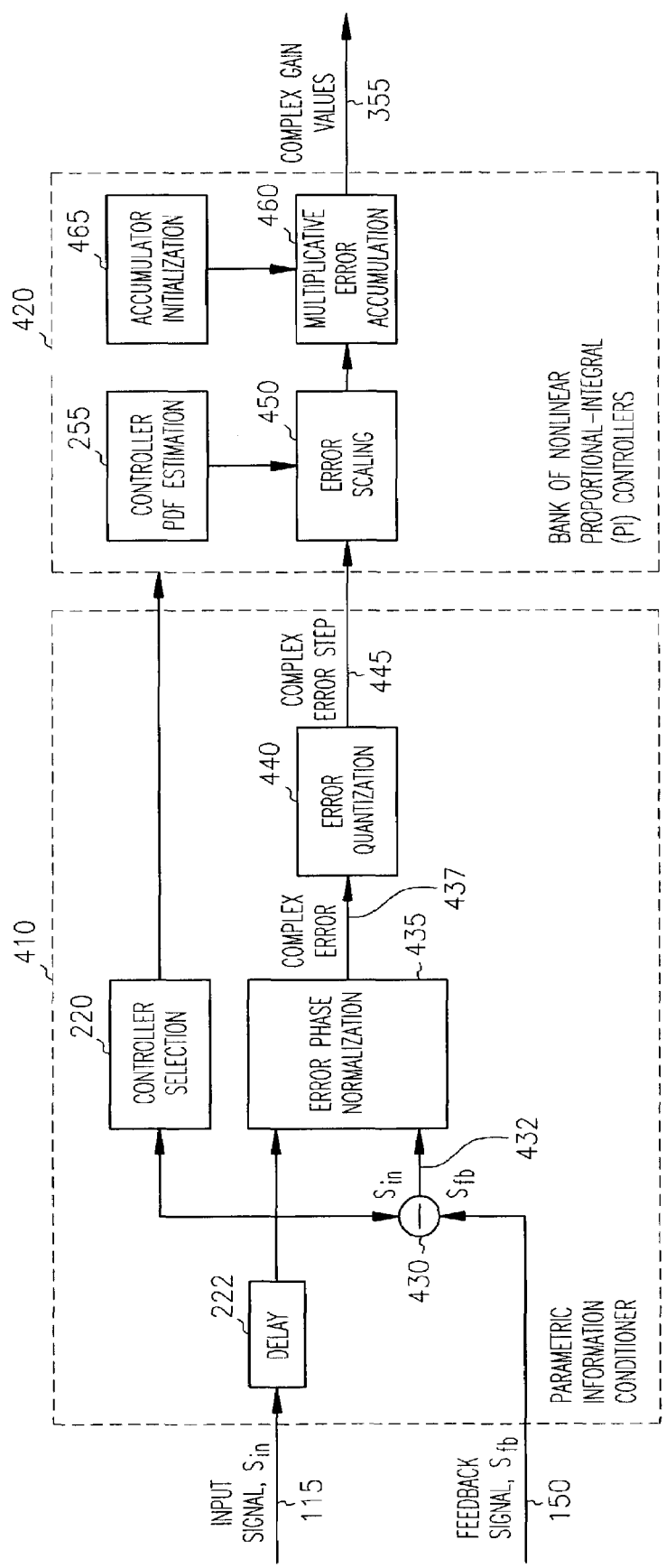
FIG. 4 is a block diagram of an alternative bank of nonlinear adaptive controllers using optimization in polar coordinates to implement memoryless linearization of a transmitter.

FIG. 4 shows a functional diagram of the discussed adaptive baseband controller 340, which employs two inputs and as many outputs as the number of complex gain elements in the predistortion gain bank 110 (see FIG. 3). Structurally, it is divided in two sections: parametric information conditioner 410 and bank of nonlinear PI controllers 420. The FBs from the first section operate over the full dynamic range of the input signal. The second section can be viewed as a waffle structure with each layer containing an identical set of FEs necessary to compose a single PI controller from the bank. The layer that processes a particular combination of input samples is chosen by the controller selection FB 220 in the conditioner section 410.

Prior to processing, the input signal $S_{fb}$ 115 is synchronized with the feedback signal $s_{fb}$ 150 in a delay FB 222. The delay FB 222 accounts for the finite propagation speed of the input signal through the bank of complex gain elements 110, the nonlinear transmitter 120 and the linear receiver 155 until it reaches the adaptive controller 340 (see FIG. 3). Following synchronization, the feedback signal is subtracted from the input signal at 430 to produce a raw complex error signal 432. The complex error signal 437 used for adaptation is created in an error phase normalization FB 435, where the phase of the raw complex error signal 432 is normalized with respect to the input signal phase. After normalization the phase of the complex error signal 437 falls within +/−45 deg around the value of average phase rotation taking place in the cascaded bank of complex gain elements 110, nonlinear transmitter 120 and linear receiver 155.

Quantization of the complex error signal is done in an error quantization FB 440, which has two purposes: (1) clipping the imaginary part of the error at −1 and 1 for negative values of its real part to provide convergence stability for arbitrary (initial) phase offset of the feedback signal 150 with respect to the input signal 115 and (2) optional mapping of the error values to a set of predefined constants for more efficient implementation of multiplicative accumulation in the PI controller bank 420. The complex error step signal is indicated at 445.

The complex error step signal is processed by a particular PI controller selected by the controller selection FB 220. First, the magnitude of the rotated complex error is normalized in an error scaling FE 450, which realizes the proportional part of the PI controller. The scaling size is inversely proportional to the probability of selecting this PI controller, which depends on the controller selection law as well as on the pdf of the input signal. Since the latter is typically non-stationary, an ensemble pdf representing the statistical probability of selecting the PI controller is continuously estimated in a controller pdf estimation FE 255 and provided to the error scaling FE 450.

A multiplicative error accumulation FE 460 is the last processing stage of this section, which realizes the integral part of the PI controller by accumulating over time the scaled complex error steps multiplied by the corresponding to them complex gain values at its output. The initial state of this FE is specified in an accumulator initialization FE 465. Its real and imaginary outputs define a complex value to determine the gain of a corresponding element from the gain bank 110 from FIG. 3.

The principles of operation of the circuit of FIG. 3 are very similar to those of FIG. 1 as described above in the subsection "*Orthogonal-Coordinate Based Adaptation of the Predistortion Gain*". Minimization of the nonlinear distortions inflicted in a signal during RF transmission can be achieved if a feedback signal, that is a downconverted and sampled version of the signal at the transmitter output, is closely matched with the input (baseband) signal to this transmitter (see Eqs. 1, 3, 4).

In one embodiment, the values of the gain bank converge to their expected optima and offer a reasonable approximation of the inverse transmitter gain. In such "small signal" adaptation model, an estimation of the magnitude and phase of divergence of the overall transmitter gain from the desired unity value (see Eq. 3) can be derived without explicit trigonometric transformations using the parametric information contained in the arbitrary-phase raw complex error $err^{ap}_{(k)}$ 432 (see FIG. 4):

$$err_{(k)}^{ap} = S_{(k)in} - S_{(k)fb}S_{(k)in}(1 - G_{(k)pd} \cdot G_{(k)tx}) = S_{(k)in}\epsilon,$$
$$\epsilon = \epsilon_m + j \cdot \epsilon_p, \epsilon \to 0\epsilon$$

$$\epsilon_m \sim abs(1 - G_{(k)pd} \cdot G_{(k)tx}), \epsilon_p \sim arg(1 - G_{(k)pd} \cdot G_{(k)tx}) \qquad 7$$

where $s_{(k)in}$ represents the input signal samples from the magnitude band k and $s_{(k)fb}$–their counterparts from the feedback branch; and $\epsilon = 1 - G_{(k)pd} \cdot G_{(k)tx}$ represents the overall transmitter gain error which is much smaller than 1 and close to zero. It is assumed that the real part of the gain error $\epsilon_m$ is directly related to the modulus of the gain error and presents a fair approximation of its deviation from zero. Similarly, the imaginary part of the gain error $\epsilon_p$ is regarded as an approximation of the nonzero argument of the error.

There is phase ambiguity in this generic format of the error that is caused by phase variations in the input signal 115. It is partially removed in the error phase normalization FB 435 where the product $s_{(k)in} \cdot \epsilon$ is rotated by an angle $\alpha_{pn}$ that is a multiple of 45 deg to generate the (phase-normalized) complex error signal $err^{pn}$ 437:

$$err^{pn}_{(k)} = S^{\epsilon}_{(k)in} e^{j\alpha_{pn}}; \alpha_{pn} = \pm n\frac{pi}{4}, |\alpha_{pn} + \arg(S_{(k)in})| \le \frac{pi}{4} \qquad 8$$

For transmission formats employing 360-deg random phase fluctuation (such as CDMA or UMTS) this normalization method provides zero degrees of mean contribution by the input signal to the phase of the complex error. In other words the average phase-normalized complex error 437 is not zeroed by the random signal phase fluctuations but is proportional to the average gain error $\epsilon$: mean[$err_{(k)}^{pn}$]= mean|$S_{(k)in}$|.mean[$\epsilon$], where the proportionality coefficient mean|$S_{(k)in}$| is the average magnitude of the input signal in this magnitude band. Signal phase fluctuations of less than 360 deg would result in similar error relationships, however, the average phase of the normalized error would be offset by an extra angle equal to the difference between the absolute average signal phase and 45 deg in this magnitude band, $$|\text{mean}[\arg(s_{(k)in})]| - \frac{pi}{4}.$$

Despite that other quantization schemes for the complex error are possible, including infinite-level- or no-quantization, application of a 1-bit quantization to the complex error in the quantization FB 440 allows for significant simplification of the followed error processing. First, the error signal can be represented by only two constants of variable sign and, thus, be invariant with respect to the signal (power) level which makes the magnitude normalization of the error easier. Second, the multiplication operation involved in the adaptation of the predistortion gains can be realized more efficiently as a scaling operation. The complex error steps produced by the error quantization FB 440 are defined by the following equations:

$$err_{(k)}^q = \epsilon_{m(k)}^q + j \cdot \epsilon_{p(k)}^q = quant[Re(err_{(k)}^{pn})] + j \cdot quant[Im(err_{(k)}^{pn})],$$

$$\epsilon_{m(k)}^q = sign[Re(err_{(k)}^{pn})]M, \epsilon_{p(k)}^q = sign[Im(err_{(k)}^{pn})]P \qquad 9$$

where $err^q_{(k)}$ is the complex error step 445; $\epsilon_{m(k)}$ and $\epsilon_{p(k)}$ are its real and imaginary parts respectively which are proportional to the magnitude and phase estimates $\epsilon_m$ and $\epsilon_p$ of the overall transmitter gain error from Eq. 11; and M and P are small positive real constants modeling the elementary adaptation steps of the predistortion gain magnitude and phase respectively. An important property of the complex error step is that the sum of it with one is a complex number Z the modulus and argument of which are strongly correlated with the magnitude and phase adaptation steps:

$$Z = 1 + err_q, abs(Z) \approx \sqrt{1 + 2\epsilon_m^q + \Delta}, arg(Z) \approx \epsilon_p^q, \text{ since}$$
$$\Delta = (\epsilon_m^q)^2 + (\epsilon_p^q)^2 << 2\epsilon_m^q; \epsilon_m^q, \epsilon_p^q << 1 \qquad 10$$

The second order magnitude term $\Delta$ is very small and has negligible influence on the adaptation process.

Normalization of the error magnitude providing independence from the parameters of the input signal and preventing 'twisting' of the predistortion values of the gain bank over dynamic range is realized in the error scaling FE 450 where the complex error steps are divided by the probability of selection of its magnitude band, which is a continuously estimated parameter. Depending on the tolerable size of the difference among the bandwidths of the PI controllers (e.g. up to 2 times) the division operation can be implemented with lower precision as a scaling operation using a finite set (e.g. a set of 256 to 1024 values) of CSD constants to approximate the full range of reciprocal probability values. Saturation of the error magnitude normalization may be considered for very small denominator values because of noise enhancement effects.

After magnitude normalization the complex error steps are subjected to a multiplicative integration operation in the multiplicative error accumulation FE 460:

$$Y_{(k)}^n = Y_{(k)}^{n-1} \cdot (1 + \mu_{(k)} \cdot err_{(k)}^q) \qquad 11$$

where $Y^n_{(k)}$ is the output of the k-th controller at the discrete time instant n; and the real parameter $\mu_{(k)}$ is the magnitude normalization. The polar-coordinate nature of this operation is illustrated below using the interpretation of the complex error step from Eq. 13:

$$abs(Y_{(k)}{}^n) = abs(Y_{(k)}{}^{n-1})$$
$$\sqrt{1+2\mu^{(k)}\epsilon_{m(k)}{}^q} \approx abs(Y_{(k)}{}^{n-1}) + abs(Y_{(k)}{}^{n-1})\mu_{(k)}\cdot\epsilon_{m(k)}{}^q$$
$$arg(Y_{(k)}{}^n) = arg(Y_{(k)}{}^{n-1}) - \mu_{(k)}\cdot\epsilon_{p(k)}{}^q \qquad 12$$

The form of these equations is very similar to the widely used polar-coordinate magnitude and phase update rules for adaptation of baseband linearizers. While the argument equation has exactly the same number of parameters, the modulus equation has the update value proportional to the past gain magnitude. This discrepancy can be classified as minor once the controller enters tracking mode, which is in the context of the "small error" model adopted in this discussion. Then, the gain magnitude varies a little and the size of the update values is only slightly affected by it. Therefore, in tracking mode the controller architecture offers predistortion gain adaptation in polar coordinates while the data is processed entirely in orthogonal coordinates.

During convergence when the overall transmitter gain differs significantly from unity and the "small error" assumption is not valid, the predistortion gain is still updated according to Eq. 12. However, the real part of the gain error $\epsilon_m$ (see Eq. 7) is weakly correlated with the magnitude of the gain error and may not be a reliable source for PI controller update. To assure stable convergence the magnitude error step parameter M in the quantization FB must be set to zero for this period. A compromise can be achieved when the magnitude error step parameter M is about 10 times smaller than its phase counterpart P to simultaneously assure stable convergence as well as non-compromised performance in tracking mode by slowing down the adaptation of the magnitude with respect to the phase.

CONCLUSION

Main features of the various embodiments proposed controller for baseband transmitter linearization are listed below. These features are not meant to be a list of advantages or benefits that each embodiment provides. Rather, some embodiments may provide some of the following features:

(a) continuous adjustment of the values of a nonlinear digital complex gain block, called a predistortion block, cascaded with the linearized transmitter, which approximate the inverse complex transmitter gain;

(b) output distortion cancellation achieved by using real-time optimization of the cascaded predistortion and transmitter gains to minimize the time-domain difference between the input and output signals of the nonlinear transmitter where the optimization data is processed in orthogonal coordinates;

(c) unconditionally convergent adaptation process with respect to the magnitude and phase of the average transmitter gain;

(d) unconditionally stable adaptation of the predistorter block gain realized by a bank of linear adaptive controllers of proportional-integral (PI) type, where the stability is enforced without additional phase compensation of the input, feedback or error signals;

(e) inherently unconditionally stable adaptation of the predistorter block gain realized by a bank of nonlinear adaptive controllers of PI type performing multiplicative error accumulation, where efficient implementation of the latter is enabled by quantizing the error samples to a small number of fixed values;

(f) invariance with respect to the (power) level of the input signal achieved using a fixed-step error updates in the adaptation process;

(g) efficient approximate normalization of the error samples with respect to the phase of the input signal achieved by rotating the error samples in 45-deg steps;

(h) significantly lower sensitivity to changes of the power and statistics of the, input signal as the adaptation process is realized by a bank of adaptive controllers operating independently form each other within a narrow dynamic range of the input signal;

(i) unbiased estimation of the complex transmitter gain and unbiased derivation of its inverse with respect to noise components, such as caused by electronic/mechanical device operation or environmental factors and which are not correlated with the transmitted signal;

(j) adaptation process free of coordinate system transformations of the input, feedback or error signals providing minimal estimation bias by noise;

(k) adaptation process free of division operations involving the input, feedback or error signals providing lower susceptibility to noise, enabling efficient implementation and increasing the system robustness;

(l) feasibility for very efficient implementation in real-time digital hardware as only a limited number of conventional storage, addition, scaling and multiplication operations are required for physical realization.

The invention claimed is:

1. An adaptive controller for adjusting the gain of a bank of complex gain elements to provide a predistorted input signal to a non-linear transmitter, the controller comprising:
a first delay coupled to an input signal;
an error phase normalizer coupled to the delayed input signal and a feedback signal from the transmitter, that provides a phase-normalized input and a phase-normalized feedback signals;
a combiner coupled to outputs of the error phase normalizer, that provides a complex error signal defined as the difference between combiner outputs;
a second delay coupled to the predistorted input signal from the gain elements;
a controller selector coupled to the input signal;
a bank of linear controllers coupled to the controller selector and the combiner, each linear controller comprising:
a phase state estimator coupled to the feedback signal and the predistorted signal;
an error rotator receiving the complex error and coupled to the phase state estimator;
an error scaler coupled to the error rotator and an accumulator coupled to it for providing complex gain values for the bank of complex gain elements.

2. The controller of claim 1 wherein the bank of linear controllers comprises:
a controller pdf estimator coupled to the error scaler; and
an accumulator estimator for initializing the error accumulator.

3. The bank of linear controllers of claim 1 wherein the error rotator performs a discrete-step rotation of the complex error signal.

4. The adaptive controller of claim 1 wherein the bank of linear controllers comprises proportional-integral controllers.

5. An adaptive controller for adjusting the gain of a bank of complex gain elements to provide a predistorted input signal to a non-linear transmitter, the controller comprising:
a delay coupled to an input signal;
a combiner that combines the delayed input signal with a feedback signal from the transmitter;

an error phase normalizer that provides a complex error signal;

an error quantizer coupled to the error phase normalizer for generating a complex error step signal;

a controller selector coupled to the input signal;

a bank of nonlinear controllers coupled to the controller selector and the error quantizer, each nonlinear controller comprising:

an error scaler and a multiplicative error accumulator coupled to it for providing complex gain values for the bank of complex gain elements.

6. The controller of claim 5 wherein the bank of nonlinear controllers comprises:

a controller pdf estimator coupled to the error scaler; and an accumulator estimator for initializing the multiplicative error accumulator.

7. The controller of claim 5 wherein the error phase normalizer creates the complex error signal after the phase of the combined delayed-input and feedback signals are normalized with respect to the phase of the input signal to fall within −45 and 45 degrees around the value of the average phase rotation taking place in the transmitter and the feedback branch of the adaptive loop comprising the linear receiver.

8. The controller of claim 5, which operates alternatively in a convergence mode and in a tracking mode.

9. The controller of claim 5 wherein predistortion gain adaptation is performed in polar coordinates while data is represented and processed entirely in orthogonal coordinates.

10. The adaptive controller of claim 5 wherein the bank of nonlinear controllers comprises nonlinear proportional-integral controllers.

11. A method of adjusting the gain of a bank of complex gain elements to provide a predistorted input signal to a non-linear transmitter, the method comprising:

delaying an input signal;

combining the delayed input signal with a feedback signal from the transmitter to extract information about transmitter nonlinearity and form an error signal;

normalizing the phase of the error signal to cancel the effect of random phase rotation in the input signal to the transmitter and to provide an error signal for unconditionally stable adaptation of a predistortion gain;

normalizing the phase of the error signal to cancel the effect of random phase rotation in the transmitter and the feedback branch of the adaptive loop comprising a linear receiver and to provide an error signal for unconditionally stable adaptation of a predistortion gain;

quantizing the phase-normalized error signal for generating an error step signal;

selecting an adaptive controller as a function of the magnitude of the input signal;

performing error accumulation in the selected adaptive controller by continuously adding finite error values of appropriate sign (phase) to the current value of an adaptively optimized parameter;

performing multiplicative error accumulation in the selected adaptive controller by continuously adding the current value of an adaptively optimized parameter to the product of the current value itself and finite error values of appropriate sign (phase);

scaling and performing error accumulation of the phase-normalized error signal or the error step signal both normalized for phase rotation in the input signal as well as in the transmitter and the linear receiver in order to provide continuously optimized complex gain values for the bank of complex gain elements.

scaling and performing multiplicative error accumulation of the phase-normalized error signal or the error step signal both normalized for phase rotation in the input signal in order to provide continuously optimized complex gain values for the bank of complex gain elements.

12. The method of claim 11 wherein no operations requiring division by the input, by the predistorted input or by the feedback signals or their delayed versions are involved in adjusting the gain of the bank of complex gain elements.

13. The method of claim 11 wherein no operations requiring orthogonal-to-polar or vise versa coordinate transformations of the input, of the predistorted input or of the feedback signals or their delayed versions are involved in adjusting the gain of the bank of complex gain elements.

* * * * *